US012701962B2

(12) United States Patent
Maeda et al.

(10) Patent No.: US 12,701,962 B2
(45) Date of Patent: Aug. 4, 2026

(54) ELECTROSTATIC CHUCK DEVICE WITH AN IMPROVED ELECTROSTATIC CHUCK PLATE

(71) Applicant: SUMITOMO OSAKA CEMENT CO., LTD., Tokyo (JP)

(72) Inventors: Keisuke Maeda, Tokyo (JP); Norito Morishita, Tokyo (JP); Tetsuro Itagaki, Tokyo (JP); Yoshiki Yoshioka, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 199 days.

(21) Appl. No.: 18/710,508

(22) PCT Filed: Nov. 7, 2022

(86) PCT No.: PCT/JP2022/041363

§ 371 (c)(1),
(2) Date: May 15, 2024

(87) PCT Pub. No.: WO2023/095596

PCT Pub. Date: Jun. 1, 2023

(65) Prior Publication Data

US 2025/0014933 A1     Jan. 9, 2025

(30) Foreign Application Priority Data

Nov. 25, 2021    (JP) ................................. 2021-190892

(51) Int. Cl.
*H10P 72/72*       (2026.01)
*H01J 37/32*       (2006.01)

(52) U.S. Cl.
CPC ...... *H10P 72/722* (2026.01); *H01J 37/32715* (2013.01); *H01J 2237/2007* (2013.01)

(58) Field of Classification Search
CPC .... H10P 72/722; H10P 72/0434; H10P 72/70; H10P 72/72; H10P 72/7614;
(Continued)

(56) References Cited

U.S. PATENT DOCUMENTS 10,688,750 B2 * 6/2020 Parkhe .................... B32B 3/266
2013/0286532 A1 * 10/2013 Kataigi ................. H10P 72/722
361/234

(Continued)

FOREIGN PATENT DOCUMENTS

JP      2013-232640 A    11/2013
JP      6634315 B2     1/2020
(Continued)

OTHER PUBLICATIONS

International Search Report for PCT/JP2022/041363 (Dec. 20, 2022).

*Primary Examiner* — Sreeya Sreevatsa
(74) *Attorney, Agent, or Firm* — Merchant & Gould P.C.

(57) ABSTRACT

An electrostatic chuck device including: an electrostatic chuck plate including a dielectric substrate that includes a placement surface on which a sample is mounted and an adsorption electrode that is positioned inside the dielectric substrate; and a base that supports the electrostatic chuck plate. The electrostatic chuck plate includes a first through-hole through which gas is supplied to the placement surface, a porous body that allows passage of the gas is inserted into the first through-hole, a first adhesive layer that bonds an inner peripheral surface of the first through-hole and an outer peripheral surface of the porous body to each other, and a thickness dimension of the first adhesive layer is 0 mm or more and 0.15 mm or less, at least in a region of 0.1 mm from the placement surface.

20 Claims, 4 Drawing Sheets

(58) Field of Classification Search
CPC .............. H10P 72/7616; H10P 72/7624; H01J
37/32715; H01J 2237/2007; H02N 13/00
USPC ......................................................... 361/234
See application file for complete search history.

(56) References Cited

U.S. PATENT DOCUMENTS

| 2019/0287838 A1* | 9/2019 | Yamaguchi | ......... H10P 72/0434 |
| 2020/0135528 A1* | 4/2020 | Shiraishi | ............. H10P 72/0434 |
| 2020/0373184 A1* | 11/2020 | Prouty | .................... H10P 72/72 |
| 2021/0175054 A1* | 6/2021 | Kusama | ............ H01J 37/32715 |
| 2021/0391204 A1 | 12/2021 | Furukawa | |

FOREIGN PATENT DOCUMENTS

| WO | 2020/153449 A1 | 7/2020 |
| WO | 2020/242661 A1 | 12/2020 |

* cited by examiner

ELECTROSTATIC CHUCK DEVICE WITH AN IMPROVED ELECTROSTATIC CHUCK PLATE

TECHNICAL FIELD

The present invention relates to an electrostatic chuck device.

This application is a National Stage Application of PCT/JP2022/041363, filed on Nov. 7, 2022, which claims priority to Japanese Patent Application No. 2021-190892, filed on Nov. 25, 2021, and which applications are incorporated herein by reference. To the extent appropriate, a claim of priority is made to each of the above disclosed applications.

BACKGROUND ART

In a semiconductor manufacturing process, an electrostatic chuck device that holds a semiconductor wafer in a vacuum environment is used. In the electrostatic chuck device, a plate-shaped sample such as a semiconductor wafer is placed on a placement surface, and an electrostatic force is generated between the plate-shaped sample and an internal electrode to adsorb and fix the plate-shaped sample. In addition, in the electrostatic chuck device, a through-hole through which gas is supplied to the placement surface for cooling a wafer mounted on the placement surface may be provided (for example, Patent Literature No. 1).

CITATION LIST

Patent Literature

[Patent Literature No. 1] Japanese Patent No. 6634315

SUMMARY OF INVENTION

Technical Problem

On the other hand, there is a concern that the through-hole for gas supply may function as an origin of abnormal discharge which leads to damage of the wafer. As a countermeasure against abnormal discharge, it is considered to insert a porous body into the through-hole. However, clogging occurs in the porous body due to particles or the like generated during wafer processing, and there is a problem in that the maintainability is poor.

An object of the present invention is to provide an electrostatic chuck device having excellent maintainability.

Solution to Problem

A first aspect of the present invention provides the following electrostatic chuck device.

The electrostatic chuck device according to the first aspect of the present invention includes: an electrostatic chuck plate including a dielectric substrate that includes a placement surface on which a sample is mounted and an adsorption electrode that is positioned inside the dielectric substrate; and a base that supports the electrostatic chuck plate from a side opposite to the placement surface, in which in the electrostatic chuck plate, a first through-hole through which gas is supplied to the placement surface is provided, a porous body that allows passage of the gas is inserted into the first through-hole, a first adhesive layer that bonds an inner peripheral surface of the first through-hole and an outer peripheral surface of the porous body to each other is provided between the inner peripheral surface and the outer peripheral surface, and a thickness dimension of the first adhesive layer is 0 mm or more and 0.15 mm or less, at least in a region of 0.1 mm from the placement surface.

The sample refers to a substance that can be mounted on the placement surface of the electrostatic chuck device and can be electrostatically chucked. The sample may be a wafer, a plate-shaped sample, or a plate.

It is also preferable that the first aspect of the present invention has the following characteristics. It is also preferable to combine two or more of these characteristics.

In the electrostatic chuck device, it is preferable that a second adhesive layer that bonds the electrostatic chuck plate and the base to each other is provided between the electrostatic chuck plate and the base, and the first adhesive layer and the second adhesive layer are separated from each other.

In the electrostatic chuck device, it is preferable that a second through-hole that is connected to the first through-hole is provided in the base, a cylindrical insulator is inserted into the second through-hole, and the insulator is in contact with the electrostatic chuck plate.

In the electrostatic chuck device, it is preferable that a second adhesive layer that bonds the electrostatic chuck plate and the base to each other is provided between the electrostatic chuck plate and the base, the second adhesive layer includes a contact portion that is in contact with the first adhesive layer and a peeling suppression portion that surrounds the contact portion, and a thickness dimension of the peeling suppression portion is more than a thickness dimension of the contact portion.

In the electrostatic chuck device, it is preferable that a second through-hole that is connected to the first through-hole is provided in the base, a cylindrical insulator is inserted into the second through-hole, an opening portion of the second through-hole, wherein the opening portion is located on an electrostatic chuck plate side, has a large-diameter portion that increases a diameter thereof, and a part of the peeling suppression portion is disposed between the large-diameter portion and an outer peripheral surface of the insulator.

In the electrostatic chuck device, it is preferable that in a plan view of the placement surface, the first adhesive layer is hidden by the porous body.

In the electrostatic chuck device, it is preferable that, in the first through-hole, a tapered surface of which a diameter thereof decreases as a distance from the placement surface in a depth direction increases is provided, and a conical surface facing the tapered surface is provided in the outer peripheral surface of the porous body.

In the electrostatic chuck device, it is preferable that a second through-hole that is connected to the first through-hole is provided in the base, a cylindrical insulator is inserted into the second through-hole, a recessed groove is provided in an end surface of the insulator on an electrostatic chuck plate side, and a part of the first adhesive layer extends up to an inside of the recessed groove.

Advantageous Effects of Invention

According to one aspect of the present invention, an electrostatic chuck device having excellent maintainability is provided.

DESCRIPTION OF EMBODIMENTS

A preferable example of each of embodiments of an electrostatic chuck device according to the present invention will be described below with reference to the drawings. In all of the following drawings, dimensions, ratios, and the like of respective components may be appropriately different from the actual ones in order to easily understand the drawings. In addition, the following description is made for better understanding of the scope of the invention, and does not limit the present invention unless otherwise specified. Within a range not departing from the present invention, changes, omissions, or additions can be made for a number, an amount, a position, a size, a numerical value, a ratio, an order, a kind, a shape, or the like. In the following description, unless specified otherwise, two or more features described as examples may be combined.

Figure 1:
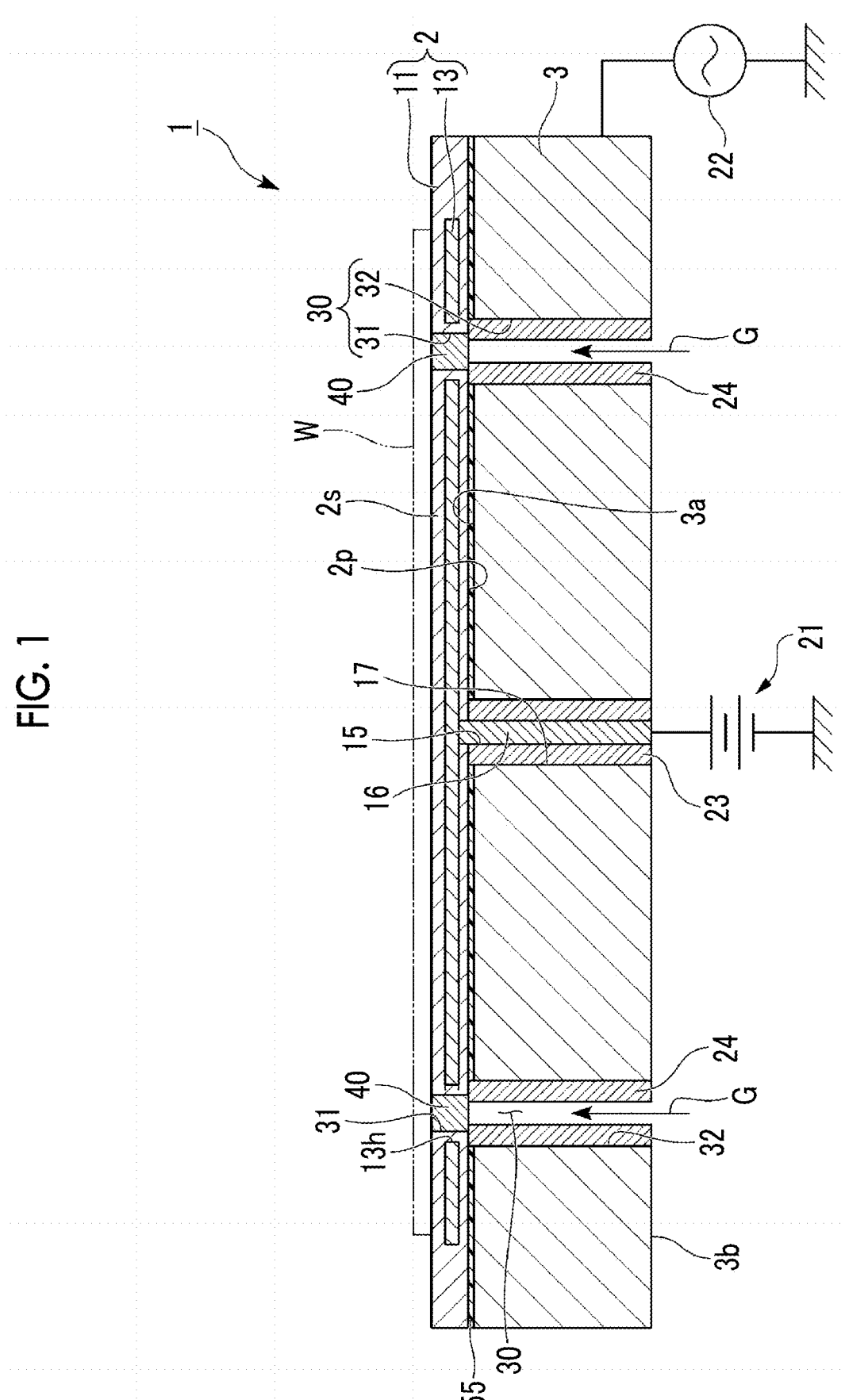
FIG. 1 is a schematic cross-sectional view illustrating an example of an electrostatic chuck device according to one embodiment of the present invention.

FIG. 1 is a schematic cross-sectional view showing an electrostatic chuck device 1 according to the present embodiment.

An electrostatic chuck device 1 includes: an electrostatic chuck plate 2 that includes a placement surface 2s on which a wafer (sample) W is mounted; a base 3 that supports the electrostatic chuck plate 2 from a side opposite to the placement surface 2s; and a feeding terminal 16 that applies a voltage to the electrostatic chuck plate 2. In an outer peripheral portion of an upper surface of the electrostatic chuck plate 2, a focus ring that surrounds the wafer W is disposed. Any shape, any size, or any material of the wafer W can be selected. For example, the wafer W is preferably a circular plate.

The electrostatic chuck plate 2 includes a dielectric substrate 11 and an adsorption electrode 13 positioned inside the dielectric substrate 11. The electrostatic chuck plate 2 adsorbs the wafer W using the placement surface 2s provided in the dielectric substrate 11.

In the following description, in each of the portions of the electrostatic chuck device 1, a side on which the wafer W is mounted on the electrostatic chuck plate 2 is described as an upper side, and a base 3 side is described as a lower side. That is, in the electrostatic chuck plate 2, an up-down direction will be referred to as a thickness direction. The up-down direction described herein is merely a direction used for simplifying the description, and does not limit a position when the electrostatic chuck device 1 is used.

The dielectric substrate 11 is formed of a composite sintered body having a sufficient mechanical strength and durability against corrosive gas and plasma thereof. As a dielectric material forming the dielectric substrate 11, a ceramic having a mechanical strength and durability against corrosive gas and plasma thereof is suitably used. As the ceramic forming the dielectric substrate 11, for example, an aluminum oxide ($Al_2O_3$) sintered body, an aluminum nitride (AlN) sintered body, or an aluminum oxide ($Al_2O_3$)-silicon carbide (SiC) composite sintered body is suitably used. In particular, from the viewpoints of dielectric characteristics, high corrosion resistance, plasma resistance, and heat resistance at a high temperature, the material forming the dielectric substrate 11 is preferably an aluminum oxide ($Al_2O_3$)-silicon carbide (SiC) composite sintered body.

The dielectric substrate 11 is a circular plate shape in a plan view. The dielectric substrate 11 includes: the placement surface 2s on which the wafer W is placed; and a back surface 2p that faces the side opposite to the placement surface 2s. In the placement surface 2s, for example, a plurality of protrusion portions (not illustrated) may be formed at predetermined intervals. The placement surface 2s supports the wafer W at tip portions of the plurality of protrusion portions.

The adsorption electrode 13 is disposed inside the dielectric substrate 11. The adsorption electrode 13 extends in a plate shape along the placement surface 2s of the dielectric substrate 11. By applying a voltage, the adsorption electrode 13 generates an electrostatic adsorption force to hold the wafer W in the placement surface 2s of the dielectric substrate 11.

The adsorption electrode 13 is formed of a composite of an insulating material and a conductive material. The insulating material in the adsorption electrode 13 is not particularly limited, and is preferably, for example, at least one selected from the group consisting of aluminum oxide ($Al_2O_3$), aluminum nitride (AlN), silicon nitride ($Si_3N_4$), yttrium (III) oxide ($Y_2O_3$), yttrium-aluminum-garnet (YAG), and $SmAlO_3$. The conductive material in the adsorption electrode 13 is preferably at least one selected from the group consisting of molybdenum carbide ($Mo_2C$), molybdenum (Mo), tungsten carbide (WC), tungsten (W), tantalum carbide (TaC), tantalum (Ta), silicon carbide (SiC), carbon black, carbon nanotubes, and carbon nanofibers.

The feeding terminal 16 for applying a direct current voltage to the adsorption electrode 13 is connected to the adsorption electrode 13. The feeding terminal 16 extends from the adsorption electrode 13 toward the lower side. The feeding terminal 16 is inserted into a through-hole 17 for a terminal that penetrates a part of the base 3 and the dielectric substrate 11 in the thickness direction. On an outer peripheral side of the feeding terminal 16, an insulator 23 for a terminal having insulating characteristics is provided. The insulator 23 for a terminal insulates the base 3 formed of a metal and the feeding terminal 16.

The feeding terminal 16 is connected to an external power supply 21. The power supply 21 applies a voltage to the adsorption electrode 13. The number, shape, and the like of the feeding terminals 16 are determined depending on the form of the adsorption electrode 13, that is, whether the adsorption electrode 13 is unipolar or bipolar.

The base 3 supports the electrostatic chuck plate 2 from the lower side. The base 3 includes: a support surface 3a facing the upper side; and a lower surface 3b facing a side opposite to the support surface 3a. The support surface 3a faces the back surface 2p of the dielectric substrate 11 in the up-down direction. The support surface 3a is in contact with the back surface 2p. That is, the base 3 supports the back surface 2p of the dielectric substrate 11 on the support surface 3a.

The base 3 is a metal member having a disk shape in a plan view. A material forming the base 3 is not particularly limited as long as it is a metal having excellent thermal conductivity, electrical conductivity, and workability or a compound material including the metal. As the material for forming the base 3, for example, an alloy of aluminum (Al), copper (Cu), stainless steel (SUS), titanium (Ti), or the like is suitably used. The material forming the base 3 is preferably an aluminum alloy from the viewpoints of thermal conductivity, electrical conductivity, and workability. It is preferable that at least a surface of the base 3 that is exposed to a plasma undergoes an alumite treatment or is coated with a resin such as a polyimide resin. In addition, it is more preferable that the entire surface of the base 3 undergoes an alumite treatment or is coated with a resin. The base 3 undergoes an alumite treatment or is coated with a resin such that plasma resistance of the base 3 is improved and abnormal discharge is prevented. Accordingly, the plasma stability of the base 3 can be improved, and surface scratches of the base 3 can also be prevented.

The body of the base 3 has a function as an internal electrode for generating a plasma. The body of the base 3 is connected to an external high-frequency power supply 22 through a matching box (not illustrated).

The base 3 is fixed to the electrostatic chuck plate 2 through an adhesive. That is, a second adhesive layer 55 that bonds the electrostatic chuck plate 2 and the base 3 to each other is provided between the electrostatic chuck plate 2 and the base 3. The second adhesive layer 55 is interposed between the back surface 2*p* of the electrostatic chuck plate 2 and the support surface 3*a* of the base 3, and the electrostatic chuck plate 2 and the base 3 are bonded and integrated. In the second adhesive layer 55, a heater that heats the electrostatic chuck plate 2 may be embedded.

As an adhesive used for the second adhesive layer 55, any adhesive can be selected, and the same adhesive as that used for a first adhesive layer 50 described below can be used. That is, it is preferable that the adhesive of the second adhesive layer 55 has heat resistance in a temperature range of −20° C. to 150° C. For example, an adhesive consisting of only at least one selected from the group consisting of an acrylic resin, a silicon resin, an epoxy resin, and the like, or an adhesive including at least one of the resins is suitable. The adhesive used for the first adhesive layer 50 and the adhesive used for the second adhesive layer 55 may be the same as or different from each other.

In the electrostatic chuck plate 2, the base 3, and the second adhesive layer 55, a plurality of gas introduction holes 30 that vertically penetrate these components are provided. The gas introduction hole 30 is opened to the placement surface 2*s*. The gas introduction hole 30 is connected to a gas supply device (not illustrated). The gas introduction hole 30 is provided for supplying a cooling gas G such as helium (He) toward the wafer W placed on the electrostatic chuck plate 2.

The gas introduction hole 30 includes: a first through-hole 31 that is a part penetrating the electrostatic chuck plate 2; and a second through-hole 32 that is a part penetrating the base 3. That is, the first through-hole 31 is provided in the electrostatic chuck plate 2, and the second through-hole 32 is provided in the base 3. Central axes of the first through-hole 31 and the second through-hole 32 match with each other. The first through-hole 31 and the second through-hole 32 communicate with each other.

The first through-hole 31 penetrates the dielectric substrate 11 of the electrostatic chuck plate 2 in the thickness direction. In addition, an evacuation hole 13*h* that surrounds the first through-hole 31 is provided in the adsorption electrode 13 of the electrostatic chuck plate 2. A part of the dielectric substrate 11 is disposed inside the evacuation hole

13*h*. Therefore, the adsorption electrode 13 is not exposed from an inner peripheral surface of the first through-hole 31.

A porous body 40 is inserted into the first through-hole 31. In the present embodiment, the first through-hole 31 is circular in a plan view. In addition, the first through-hole 31 extends in the up-down direction in a uniform cross-sectional shape. Accordingly, the porous body 40 has a columnar shape extending in the up-down direction.

The porous body 40 is formed of an insulating material. The porous body 40 is formed of a sprayed film or a porous ceramic as a forming material. In the porous body 40, a plurality of pores are provided. The plurality of pores in the porous body 40 are connected to each other. Therefore, the porous body 40 can allow passage of gas G in the first through-hole 31.

In the present embodiment, the first through-hole 31 is blocked by the porous body 40. Since the porous body 40 is formed of an insulating material, the porous body 40 restricts the gas introduction hole 30 from functioning as a passage of charge and suppresses the occurrence of abnormal discharge in the electrostatic chuck device 1. As a result, the highly reliable electrostatic chuck device 1 can be provided.

In the present invention, the thickness (the length in the depth direction) of the porous body 40 can be freely selected, and may be optionally set to be more than, less than, or the same as the thickness of the electrostatic chuck plate 2. The diameter of the porous body 40 can be freely selected and, for example, may be the same an inner diameter of the gas introduction hole 30 or may be the inner diameter or more.

Figure 2:
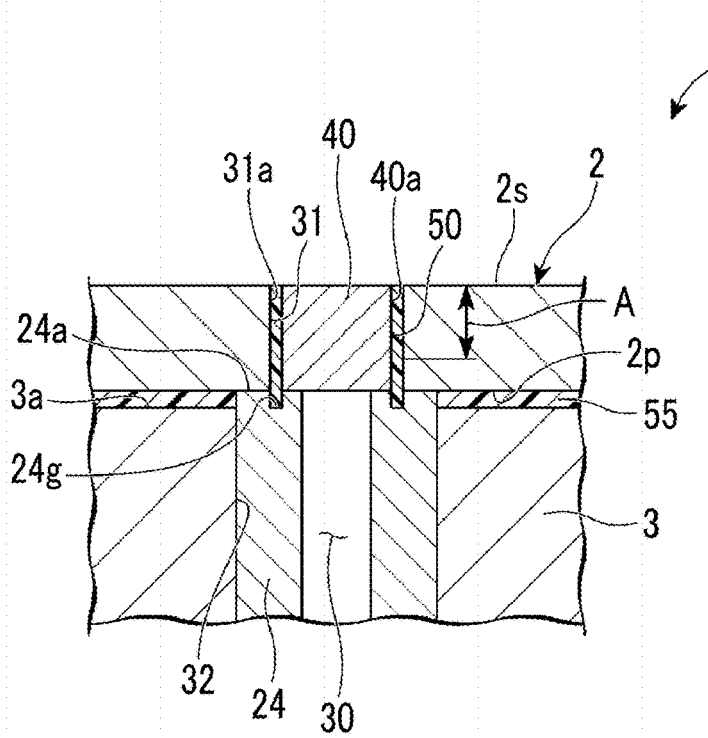
FIG. 2 is a schematic partial cross-sectional view illustrating the electrostatic chuck device according to the embodiment of the present invention.

FIG. 2 is a schematic partial cross-sectional view illustrating an example of the electrostatic chuck device 1 around the gas introduction hole 30.

The porous body 40 is bonded and fixed to an inner peripheral surface 31*a* of the first through-hole 31. The first adhesive layer 50 is provided between the inner peripheral surface 31*a* of the first through-hole 31 and an outer peripheral surface 40*a* of the porous body 40. The first adhesive layer 50 bonds the inner peripheral surface 31*a* of the first through-hole 31 and the outer peripheral surface 40*a* of the porous body 40 to each other.

In the present embodiment, the porous body 40 is bonded to the inner peripheral surface 31*a* of the first through-hole 31 using the first adhesive layer 50. In the present embodiment, the porous body 40 can be easily and stably fixed to the electrostatic chuck plate 2 without performing a special process on the porous body 40 and the first through-hole 31.

A thickness dimension of the first adhesive layer 50 is preferably 0 mm or more and 0.15 mm or less at least in a region A of 0.1 mm from the placement surface 2*s*. Here, the thickness dimension of the first adhesive layer 50 refers to the dimension of the first adhesive layer 50 in a radial direction with respect to the center of the first through-hole 31. In addition, the region A of 0.1 mm from the placement surface 2*s* refers to a range of the first through-hole 31 in the depth direction. When the depth of the first through-hole 31 is 0.1 mm or less, the thickness of the first adhesive layer 50 is 0.15 mm or less in the overall length of the first through-hole 31.

The porous body 40 according to the present embodiment is exposed to the placement surface 2*s* side. Therefore, a configuration in which the porous body 40 can be easily separated from the placement surface 2*s* side can be realized, the porous body 40 can be easily replaced, and the maintainability of the electrostatic chuck device 1 can be improved. However, on the other hand, when the porous body 40 is exposed to the placement surface 2s, the first adhesive layer 50 for fixing the porous body 40 is likely to be exposed to the placement surface 2s side, and the first adhesive layer 50 is likely to be eroded by plasma.

On the other hand, in the first adhesive layer 50 according to the present embodiment, the thickness is 0.15 mm or less in the region A of 0.1 mm from the placement surface 2s at which plasma is likely to arrive. Therefore, the first adhesive layer 50 is not likely to be eroded by plasma. In the present embodiment, while exposing the porous body 40 to the placement surface 2s side to improve the maintainability of the electrostatic chuck device 1, the erosion of the first adhesive layer 50 can be suppressed, and the porous body 40 can be stably held by the first through-hole 31.

The first adhesive layer 50 according to the present embodiment may have a thickness of 0 mm in the range of 0.1 mm from the placement surface 2s. That is, the first adhesive layer 50 may be formed only on a lower side below the above-described range. In addition, as illustrated in FIG. 2, the first adhesive layer 50 may have a uniform thickness of 0.15 mm or less in the entire area of the first through-hole 31 in the depth direction.

As the adhesive used for the first adhesive layer 50, any adhesive can be selected, and an adhesive having heat resistance in a temperature range of −20° C. to 150° C. is preferable. For example, an adhesive consisting of only at least one selected from the group consisting of an acrylic resin, a silicon resin, an epoxy resin, and the like, or an adhesive including at least one of the resins is suitable. An acrylic resin adhesive, a silicon resin adhesive, an epoxy resin adhesive, or the like may be preferably selected.

The first adhesive layer 50 is formed by applying an uncured adhesive to the inner peripheral surface 31a of the first through-hole 31 or the outer peripheral surface 40a of the porous body 40, inserting the porous body 40 into the first through-hole 31, and curing the adhesive. By inserting the porous body 40 into the first through-hole 31 from the upper side, most of the adhesive flows to the region of the lower side in the inner peripheral surface 31a of the first through-hole 31 during the insertion, and a significant increase in the thickness of the first adhesive layer 50 in the range of 0.1 mm from the placement surface 2s can be suppressed.

A porosity of the porous body 40 is preferably 40% or more and 60% or less. A part of the pores of the porous body 40 is opened to the outer peripheral surface of the porous body 40. By setting the porosity to be 40% or more, the uncured adhesive applied to the inner peripheral surface 31a of the first through-hole 31 or the outer peripheral surface 40a of the porous body 40 can easily infiltrate into from the outer peripheral surface 40a of the porous body 40 into the pores. As a result, even when the amount of the adhesive applied is excessively large during the insertion of the porous body 40 into the first through-hole 31, the overflow of the adhesive from the first through-hole 31 can be suppressed. By setting the porosity to be 60% or less, abnormal discharge from the gas introduction hole 30 as an origin can be more reliably suppressed.

Here, "porosity" refers to a ratio of the total volume of the pores to a predetermined unit volume of the porous body 40. The porosity may be a value obtained from a ratio between a true density of the forming material of the porous body 40 to an apparent density of the porous body 40, or may be obtained by measuring the volume of pores per unit volume. As the porosity of the porous body 40 increases, the volume of the pores increases, and the gas G is likely to flow out.

The second through-hole 32 is connected to the first through-hole. A cylindrical insulator 24 is inserted into the second through-hole 32. An outer peripheral surface of the insulator 24 is fixed to the second through-hole 32, for example, using an adhesive. The inside of the insulator 24 functions as a passage route of the gas G.

The insulator 24 is formed of, for example, a ceramic as a forming material. That is, the insulator 24 is formed of an insulating member. As a result, the insulator 24 can suppress the functioning of the gas introduction hole 30 as an origin of abnormal discharge. The insulator 24 has durability against plasma. As the ceramic forming the insulator 24, a ceramic including one kind or two or more kinds selected from aluminum nitride (AlN), aluminum oxide (Al$_2$O$_3$), silicon nitride (Si$_3$N$_4$), zirconium oxide (ZrO$_2$), sialon, boron nitride (BN), and silicon carbide (SiC) can be adopted.

A part of an upper end surface 24a of the insulator 24 is in contact with the back surface 2p of the electrostatic chuck plate 2. In addition, a part of the upper end surface 24a of the insulator 24 is in contact with a lower surface of the porous body 40. In the present embodiment, a recessed groove 24g that is recessed to the lower side is provided in the upper end surface 24a (that is, an end surface on the electrostatic chuck plate 2 side) of the insulator 24. The recessed groove 24g extends in a ring shape along a peripheral direction of the insulator 24. When seen from an axial direction, the recessed groove 24g overlaps the inner peripheral surface 31a of the first through-hole 31. For example, an inner diameter (diameter of a ring generated by the recessed groove 24g) positioned outside of the recessed groove 24g is preferably more than the diameter of the porous body 40.

The recessed groove 24g according to the present embodiment is disposed immediately below the first adhesive layer 50. Therefore by applying an uncured adhesive to the inner peripheral surface 31a of the first through-hole 31 or the outer peripheral surface 40a of the porous body 40 and inserting the porous body 40 into the first through-hole 31, a part of the uncured adhesive can be accommodated in the recessed groove 24g. As a result, a part of the first adhesive layer 50 according to the present embodiment extends up to the inside of the recessed groove 24g. In the present embodiment, even when the amount of the adhesive applied is excessively large during the insertion of the porous body 40 into the first through-hole 31, the adhesive can be retained in the recessed groove 24g. Therefore, the overflow of the adhesive from the first through-hole 31 can be suppressed. As a result, a significant increase in the thickness of the first adhesive layer 50 in the region A in the vicinity of the placement surface 2s can be effectively suppressed.

In the present embodiment, the insulator 24 is in contact with the electrostatic chuck plate 2. More specifically, the upper end surface 24a of the insulator 24 is in contact with the back surface 2p of the electrostatic chuck plate 2. Therefore, the first adhesive layer 50 and the second adhesive layer 55 are partitioned from each other by the insulator 24. That is, the first adhesive layer 50 and the second adhesive layer 55 are separated from each other. The first adhesive layer 50 is in contact with the upper end surface 24a of the insulator 24 and the recessed groove 24g, and the second adhesive layer 55 is in contact with the outer peripheral surface of the insulator 24.

When the porous body 40 is replaced, an operator pulls off the porous body 40 from the upper side or pushes out the porous body 40 from the lower side such that a force acting toward the upper side is applied to the porous body 40 to separate the porous body 40 from the electrostatic chuck plate 2. At this time, a force to break the first adhesive layer 50 is applied to the first adhesive layer 50 for separating the porous body 40.

In the present embodiment, since the first adhesive layer 50 and the second adhesive layer 55 are separated from each other, the application of stress to the second adhesive layer 55 can be suppressed during the separation of the porous body 40. That is, in the present embodiment, damage to the second adhesive layer 55 during the replacement of the porous body 40 can be suppressed, and a decrease in the reliability of the electrostatic chuck plate 2 after the replacement of the porous body 40 can be suppressed.

In addition, in the present embodiment, since the first adhesive layer 50 and the second adhesive layer 55 are separated from each other, the occurrence of abnormal discharge in the first adhesive layer 50 and the second adhesive layer 55 can be suppressed. That is, in the present embodiment, the occurrence of abnormal discharge caused by the separation of the first adhesive layer 50 and the second adhesive layer 55 can be suppressed.

Modification Example

Next, examples of porous bodies according to a plurality of modification examples of the above-described embodiment that can be adopted and peripheral configurations thereof will be described. In the following description of each of the modification examples, components having the same aspect in the above-described embodiment and the modification examples will be represented by the same reference numerals, and the description thereof will not be repeated. In addition, in each of the modification examples described below, the thickness of the first adhesive layer is 0.15 mm or less in the region A of 0.1 mm from the placement surface.

Modification Example 1

Figure 3:
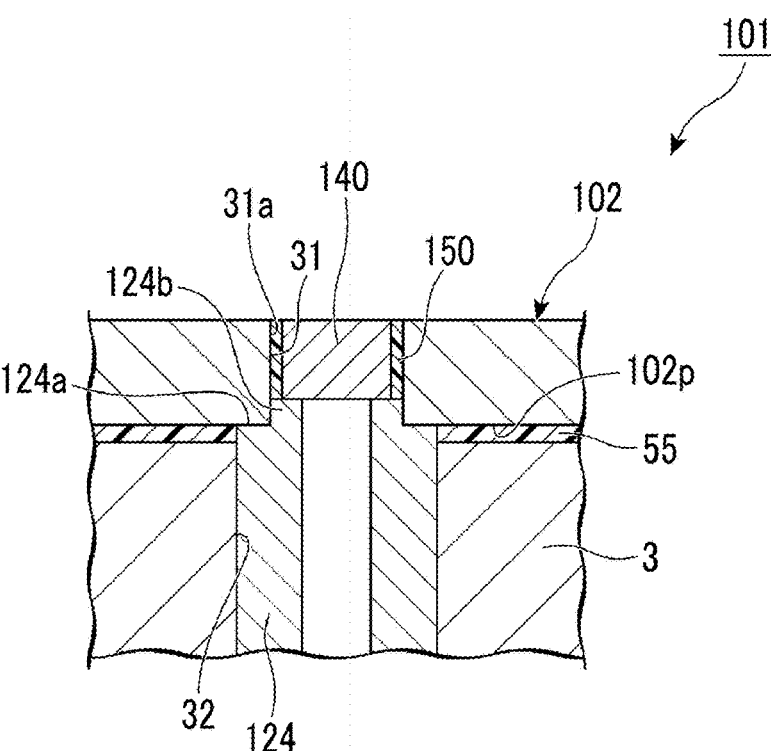
FIG. 3 is a schematic partial cross-sectional view illustrating an electrostatic chuck device according to Modification Example 1 of the present invention.

FIG. 3 is a schematic partial cross-sectional view illustrating an electrostatic chuck device 101 according to Modification example 1.

As in the above-described embodiment, a porous body 140 is bonded and fixed to the inner peripheral surface 31*a* of the first through-hole 31 through a first adhesive layer 150. On the other hand, a cylindrical insulator 124 is inserted into the second through-hole 32.

A part of an upper end surface 124*a* of the insulator 124 is in contact with a back surface 102*p* of an electrostatic chuck plate 102. A step portion 124*b* is provided in the upper end surface 124*a* of the insulator 124. The step portion 124*b* protrudes to the upper side with respect to the upper end surface 124*a*. In the present modification example, a lower end surface of the porous body 140 is withdrawn to the upper side with respect to the back surface 102*p* of the electrostatic chuck plate 102. The step portion 124*b* is cylindrical with respect to a center line of the insulator 124. That is, the insulator 124 includes two upper end surfaces having different height positions when seen from a cross-section. An outer diameter of the step portion 124*b* is less than an outer diameter of the insulator 124 of a portion other than the step portion 124*b*. The step portion 124*b* is inserted into the first through-hole 31. A tip end surface of the step portion 124*b* is in contact with a lower surface of the porous body 140. In the present modification example, a configuration in which a gap is interposed between the first adhesive layer 150 and the second adhesive layer 55 in a stepwise shape can be adopted. In the present example, the thickness of the porous body 140 may be less than the thickness of the electrostatic chuck plate 102.

The first adhesive layer 150 and the second adhesive layer 55 according to the present modification example are separated from each other as in the above-described embodiment. In particular, in the present modification example, due to the step portion 124*b* of the insulator 124, a lower end position of the first adhesive layer 150 is disposed on the upper side above the second adhesive layer 55, and the adhesive forming the first adhesive layer 150 is not likely to arrive at the second adhesive layer 55 during manufacturing. That is, in the present modification example, the first adhesive layer 150 and the second adhesive layer 55 can be more reliably separated from each other. Therefore, when the porous body 140 is separated and replaced, the application of stress to the second adhesive layer 55 can be more reliably suppressed, and damage to the second adhesive layer 55 can be suppressed.

Modification Example 2

Figure 4:
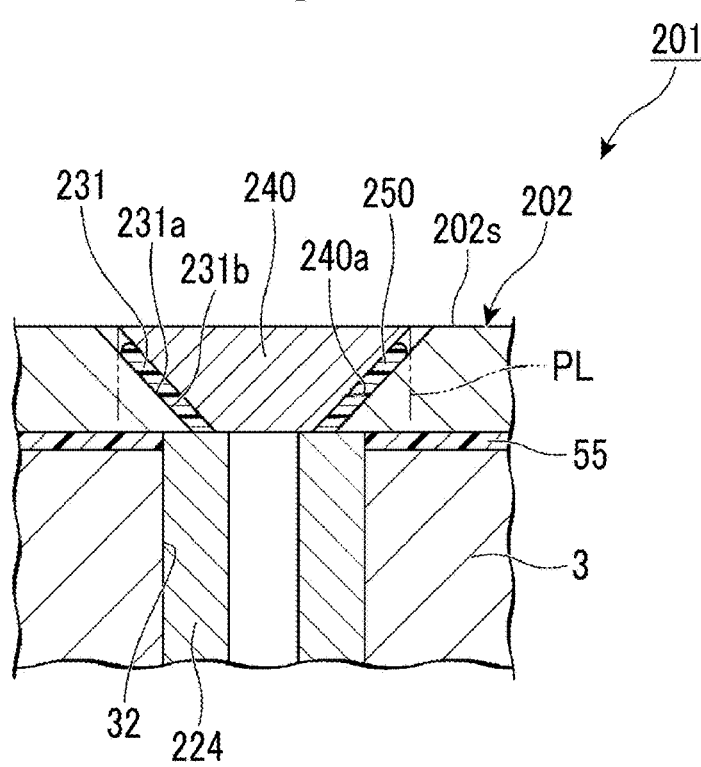
FIG. 4 is a schematic partial cross-sectional view illustrating an electrostatic chuck device according to Modification Example 2 of the present invention.

FIG. 4 is a schematic partial cross-sectional view illustrating an electrostatic chuck device 201 according to Modification Example 2.

As in the above-described embodiment, a porous body 240 is bonded and fixed to an inner peripheral surface 231*a* of a first through-hole 231 through a first adhesive layer 250. On the other hand, a cylindrical insulator 224 is inserted into the second through-hole 32.

In the inner peripheral surface 231*a* of the first through-hole 231, a tapered surface 231*b* of which an inner diameter decreases toward the lower side is provided. That is, in the first through-hole 231, the tapered surface 231*b* of which a diameter decreases as a distance from a placement surface 202*s* of an electrostatic chuck plate 202 in the depth direction increases is provided. The tapered surface 231*b* according to the present modification example is provided over the entire inner peripheral surface 231*a* in the up-down direction. The tapered surface 231*b* may be provided in a part of the inner peripheral surface 231*a*. For example, the tapered surface may be provided only the upper side portion, a through-hole that includes a cylindrical portion having the same inner diameter as a minimum inner diameter of the tapered surface portion may be formed in a lower side portion following the tapered surface, or a porous body corresponding to the shape may be used.

On the other hand, a conical surface 240*a* facing the tapered surface 231*b* is provided in a outer peripheral surface of the porous body 240. In the conical surface 240*a*, a diameter decreases toward the lower side. The first adhesive layer 250 is disposed between the tapered surface 231*b* and the conical surface 240*a*. The porous body 240 has a truncated conical shape of which a diameter decreases as the distance from the placement surface 202*s* in the depth direction increases.

As illustrated in FIG. 4, an upper end of the first adhesive layer 250 is disposed slightly below an upper end of a gap between the tapered surface 231*b* and the conical surface 240*a*. Therefore, the first adhesive layer 250 is disposed to be hidden by the lower side of the upper end of the porous body 240. That is, in the present modification example, the first adhesive layer 250 is hidden in the porous body 240 in a plan view of the placement surface 202*s*.

Here, the plan view of the placement surface 202*s* refers to the plan of the placement surface 202*s* from a direction perpendicular to the placement surface 202*s*. Accordingly, as illustrated in FIG. 4, when a perpendicular line PL is drawn from an outer edge positioned in an upper end of the porous body 240, the first adhesive layer 250 is disposed on the center side of the first through-hole 231 further than the perpendicular line PL.

In the present modification example, the erosion of the first adhesive layer 250 by plasma acting in a direction perpendicular to the placement surface 202s can be suppressed. As a result, while exposing the porous body 240 to the placement surface 202s side, the erosion of the first adhesive layer 250 can be suppressed, and the porous body 240 can be stably held in the first through-hole 231.

Modification Example 3

Figure 5:
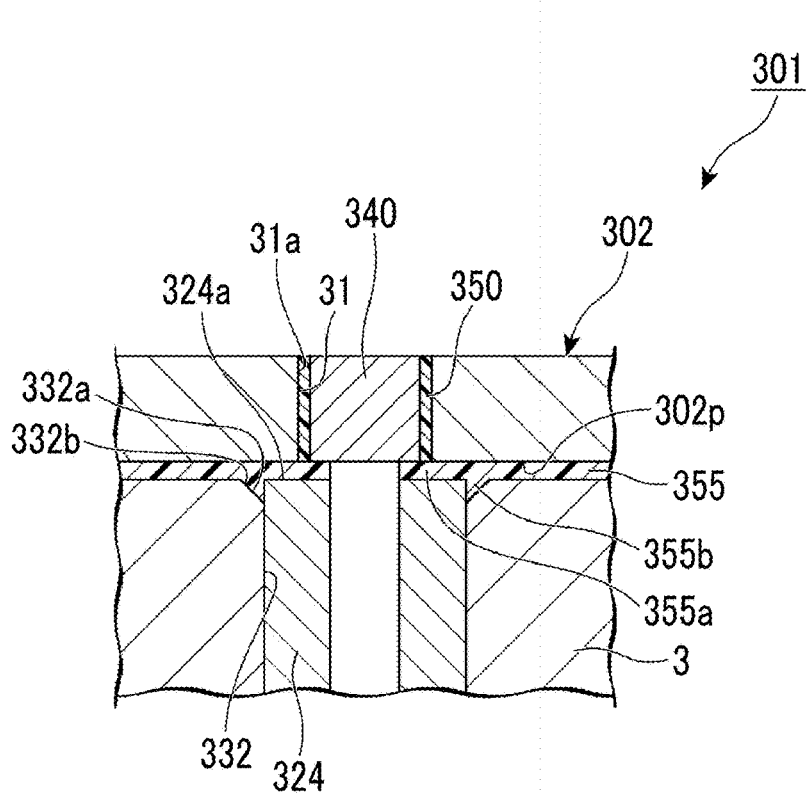
FIG. 5 is a schematic partial cross-sectional view illustrating an electrostatic chuck device according to Modification Example 3 of the present invention.

FIG. 5 is a schematic partial cross-sectional view illustrating an electrostatic chuck device 301 according to Modification Example 3.

As in the above-described embodiment, a porous body 340 is bonded and fixed to the inner peripheral surface 31a of the first through-hole 31 through a first adhesive layer 350. On the other hand, a cylindrical insulator 324 is inserted into a second through-hole 332.

In the present modification example, a second adhesive layer 355 is interposed between an upper end surface 324a of the insulator 324 and a back surface 302p of an electrostatic chuck plate 302 and between the upper end surface 324a of the insulator 324 and the porous body 340. Therefore, the insulator 324 according to the present modification example is not in contact with the electrostatic chuck plate 302 and the porous body 340. In addition, in the present modification example, the first adhesive layer 350 and the second adhesive layer 355 are in direct contact with each other. The second adhesive layer 355 according to the present modification example includes a contact portion 355a that is positioned immediately below the first adhesive layer 350 and is in contact with the first adhesive layer 350. The contact portion 355a according to the present modification example is in contact with the first adhesive layer 350 in the depth direction of the first through-hole 32.

In an opening of an upper side of the second through-hole 332 according to the present modification example, a tapered surface 332b of which a diameter (inner diameter) increases toward the upper side is provided. The tapered surface 332b extends in a peripheral direction with respect to the center of the second through-hole 332. In the second through-hole 332, the diameter increases in a region where the tapered surface 332b is provided. That is, a large-diameter portion 332a that increases a diameter is provided in an opening portion of the second through-hole 332 on the electrostatic chuck plate 302 side.

An outer peripheral surface of the insulator 324 is circular when seen from the up-down direction. Therefore, a gap is provided between the outer peripheral surface of the insulator 324 and the tapered surface 332b. In a manufacturing process of the electrostatic chuck device 1, a part of the adhesive forming the second adhesive layer 355 infiltrates between the outer peripheral surface of the insulator 324 and the tapered surface 332b and is cured. The second adhesive layer 355 according to the present modification example includes a thick portion (peeling suppression portion) 355b in the upper side of the large-diameter portion 332a. The thick portion 355b surrounds the first through-hole 31 and the second through-hole 332 when seen from the up-down direction.

The thick portion 355b extends in a peripheral direction with respect to the center of the second through-hole 332.

The thick portion 355b is disposed outside the contact portion 355a and surrounds the contact portion 355a. In addition, a thickness dimension of the thick portion 355b is more than a thickness dimension of the contact portion 355a.

The second adhesive layer 355 according to the present modification example includes the contact portion 355a in contact with the first adhesive layer 350. Therefore, when the porous body 340 is replaced, a force acting toward the upper side that is applied to the first adhesive layer 350 is transmitted from the first adhesive layer 350 to the contact portion 355a of the second adhesive layer 355. There is a concern that the force to separate the porous body 340 may break the first adhesive layer 350 and may damage a part (contact portion 355a) of the second adhesive layer 355.

In the second adhesive layer 355 according to the present modification example, the contact portion 355a is surrounded by the thick portion 355b. The thick portion 355b has a larger thickness dimension than the contact portion 355a, and thus has a high strength. That is, in the second adhesive layer 355, the strength is locally increased in the thick portion 355b. The force to break the contact portion 355a is received by the thick portion 355b, and the damage to the contact portion 355a is not likely to be transmitted to the outside of the thick portion 355b. In the present modification example, the occurrence of damage such as deterioration of the function of the second adhesive layer 355 during the replacement of the porous body 340 can be suppressed, and the reliability of the electrostatic chuck plate 302 after the replacement of the porous body 340 can be improved.

In the second adhesive layer 355 according to the modification example, the thick portion 355b of which the thickness dimension is increased by providing the large-diameter portion 332a in the second through-hole 332 can be formed. That is, a part of the thick portion 355b according to the present modification example is disposed between the large-diameter portion 332a and the outer peripheral surface of the insulator 324. In the present modification example, a complicated structure is not required, and the thick portion 355b that surrounds the contact portion 355a can be formed.

In the present modification example, the case where the tapered surface 332b is formed at the opening portion of the second through-hole 332 and the large-diameter portion 332a is provided inside the tapered surface 332b has been described. However, the configuration of the large-diameter portion 332a is not limited to the present modification example. For example, the large-diameter portion may be formed by forming the step portion at the opening portion of the second through-hole.

Modification Example 4

Figure 6:
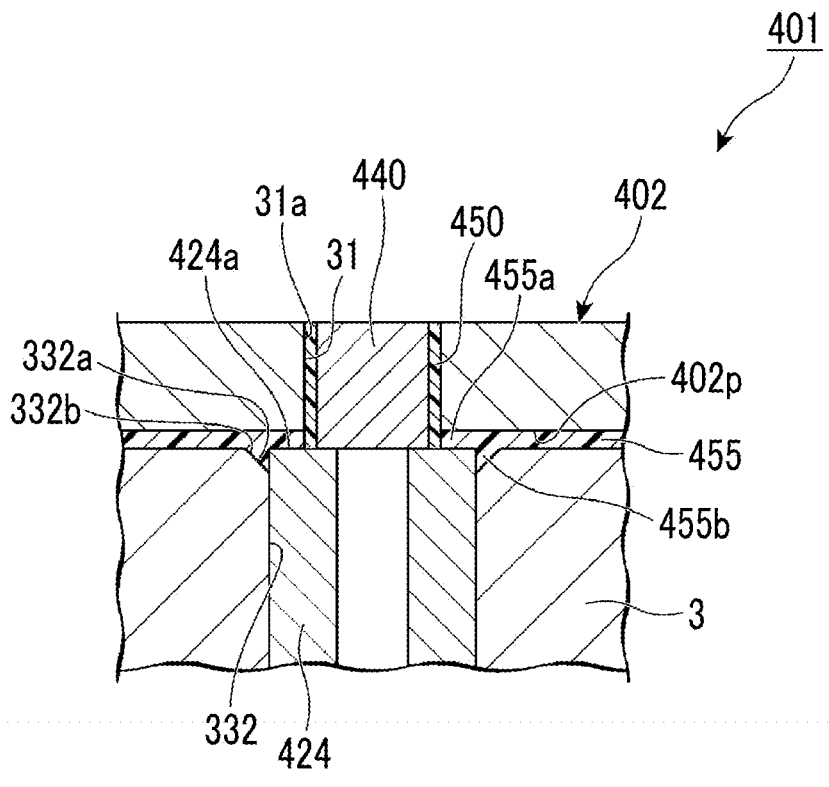
FIG. 6 is a schematic partial cross-sectional view illustrating an electrostatic chuck device according to a modification example 4 of the present invention.

FIG. 6 is a schematic partial cross-sectional view illustrating an electrostatic chuck device 401 according to Modification Example 4.

As in the above-described embodiment, a porous body 440 is bonded and fixed to the inner peripheral surface 31a of the first through-hole 31 through a first adhesive layer 450. On the other hand, a cylindrical insulator 424 is inserted into the second through-hole 332.

In the present modification example, a second adhesive layer 455 is interposed between an upper end surface 424a of the insulator 424 and a back surface 402p of an electrostatic chuck plate 402. Therefore, the insulator 424 according to the present modification example is not in contact with the electrostatic chuck plate 402. On the other hand, the upper end surface of the insulator 424 according to the present modification example is in contact with a lower end surface of the porous body 440.

In the present modification example, the lower end surface of the porous body 440 protrudes to the lower side with respect to the back surface 402p of the electrostatic chuck plate 402. Accordingly, the lower end surface of the porous body 440 is positioned below the back surface 402p of the electrostatic chuck plate 402. The porous body 440 is surrounded by the second adhesive layer 455 in an outer peripheral surface of a lower end portion positioned below the back surface 402p. The first adhesive layer 450 is disposed between the outer peripheral surface of the porous body 440 and the second adhesive layer 455. That is, in the present modification example, the first adhesive layer 450 and the second adhesive layer 455 are in direct contact with each other. The second adhesive layer 455 according to the present modification example includes a contact portion 455a that surrounds the first adhesive layer 450 and is in contact with the first adhesive layer 450. The contact portion 455a according to the present modification example is in contact with the first adhesive layer 450 in the radial direction of the first through-hole 32.

The second through-hole 332 according to the present modification example has the same configuration as Modification Example 3. That is, a large-diameter portion 332a that increases a diameter is provided in an opening portion of the second through-hole 332 on the electrostatic chuck plate 402 side. The second adhesive layer 455 according to the present modification example includes a thick portion (peeling suppression portion) 455b in the upper side of the large-diameter portion 332a. The thick portion 455b surrounds the first through-hole 31 and the second through-hole 332 when seen from the up-down direction.

In the second adhesive layer 455 according to the present modification example, the contact portion 455a is surrounded by the thick portion 455b. As a result, even when damage to the contact portion 455a occurs during the replacement of the porous body 440, the spread of the damage to the outside of the thick portion 355b can be suppressed. In the present modification example, the occurrence of damage such as deterioration of the function of the second adhesive layer 455 during the replacement of the porous body 440 can be suppressed, and the reliability of the electrostatic chuck plate 402 after the replacement of the porous body 440 can be improved.

Hereinabove, various embodiments of the present invention has been described. However, the configurations of the embodiments, a combination thereof, and the like are exemplary, and additions, omissions, replacements and other changes can be made for the configurations within a range not departing from the scope of the present invention. Further, the present invention is not limited to the embodiments.

INDUSTRIAL APPLICABILITY

The present invention can provide the electrostatic chuck device having excellent maintainability.

REFERENCE SIGNS LIST 1, 101, 201, 301, 401: electrostatic chuck device
2, 102, 202, 302, 402: electrostatic chuck plate
2s, 202s: placement surface
2p, 102p, 302p, 402p: back surface of electrostatic chuck plate
3: base 3a: support surface of base
3b: lower surface of base
11: dielectric substrate
13: adsorption electrode
13h: evacuation hole
15: insertion hole
16: feeding terminal
17: through-hole for terminal
21: external power supply
22: external high-frequency power supply
23: insulator for terminal
24, 124, 224, 324, 424: insulator
24a, 124a, 324a, 424a: upper end surface of insulator
24g: recessed groove
30: gas introduction hole
31, 231: first through-hole
31a, 231a: inner peripheral surface
32, 332: second through-hole
40, 140, 240, 340, 440: porous body
40a: outer peripheral surface
50, 150, 250, 350, 450: first adhesive layer
55, 355, 455: second adhesive layer
124b: step portion
231b, 332b: tapered surface
240a: conical surface
332a: large-diameter portion
355a, 455a: contact portion
355b, 455b: thick portion (peeling suppression portion)
A: region of 0.1 mm from placement surface
G: gas
PL: perpendicular line
W: wafer (sample)

The invention claimed is:

1. An electrostatic chuck device comprising:
an electrostatic chuck plate including
a dielectric substrate that includes a placement surface on which a sample is mounted and
an adsorption electrode that is positioned inside the dielectric substrate; and
a base that supports the electrostatic chuck plate from a side opposite to the placement surface,
wherein
in the electrostatic chuck plate, a first through-hole through which gas is supplied to the placement surface is provided,
a porous body that allows passage of the gas is inserted into the first through-hole,
a first adhesive layer that bonds an inner peripheral surface of the first through-hole and an outer peripheral surface of the porous body to each other is provided between the inner peripheral surface and the outer peripheral surface, and
a thickness dimension of the first adhesive layer is 0 mm or more and 0.15 mm or less, at least in a region of 0.1 mm from the placement surface.

2. The electrostatic chuck device according to claim 1,
wherein a second adhesive layer that bonds the electrostatic chuck plate and the base to each other is provided between the electrostatic chuck plate and the base, and
the first adhesive layer and the second adhesive layer are separated from each other.

3. The electrostatic chuck device according to claim 2,
wherein a second through-hole that is connected to the first through-hole is provided in the base,
a cylindrical insulator is inserted into the second through-hole, and the cylindrical insulator is in contact with the electrostatic chuck plate.

4. The electrostatic chuck device according to claim 3, wherein in a plan view of the placement surface, the first adhesive layer is hidden by the porous body, in the first through-hole, a tapered surface of which a diameter thereof decreases as a distance from the placement surface in a depth direction increases is provided, and a conical surface facing the tapered surface of the first through-hole is provided in the outer peripheral surface of the porous body.

5. The electrostatic chuck device according to claim 3, wherein a recessed groove is provided in an end surface of the cylindrical insulator on an electrostatic chuck plate side, and a part of the first adhesive layer extends up to an inside of the recessed groove.

6. The electrostatic chuck device according to claim 3, wherein the cylindrical insulator has a cylindrical step portion, which is provided in an upper end surface of the cylindrical insulator and protrudes to an upper side, an outer diameter of the step portion is less than an outer diameter of other portion of the cylindrical insulator, and the step portion is inserted into the first through-hole, and an end surface of the step portion is in contact with a lower surface of the porous body.

7. The electrostatic chuck device according to claim 1, wherein a second adhesive layer that bonds the electrostatic chuck plate and the base to each other is provided between the electrostatic chuck plate and the base, the second adhesive layer includes a contact portion that is in contact with the first adhesive layer and a peeling suppression portion that surrounds the contact portion, wherein a thickness dimension of the peeling suppression portion is more than a thickness dimension of the contact portion.

8. The electrostatic chuck device according to claim 7, wherein a second through-hole that is connected to the first through-hole is provided in the base, a cylindrical insulator is inserted into the second through-hole, an opening portion of the second through-hole, wherein the opening portion is located on an electrostatic chuck plate side, has a large-diameter portion that increases a diameter thereof, and a part of the peeling suppression portion is disposed between the large-diameter portion and an outer peripheral surface of the cylindrical insulator.

9. The electrostatic chuck device according to claim 8, wherein in a plan view of the placement surface, the first adhesive layer is hidden by the porous body, in the first through-hole, a tapered surface of which a diameter thereof decreases as a distance from the placement surface in a depth direction increases is provided, and a conical surface facing the tapered surface of the first through-hole is provided in the outer peripheral surface of the porous body.

10. The electrostatic chuck device according to claim 8, wherein a recessed groove is provided in an end surface of the cylindrical insulator on an electrostatic chuck plate side, and a part of the first adhesive layer extends up to an inside of the recessed groove.

11. The electrostatic chuck device according to claim 8, wherein the large-diameter portion is a portion of the second through-hole where a tapered surface is provided, the diameter of the large-diameter portion is an inner diameter of the large-diameter portion, and the inner diameter of the large-diameter portion gradually increases, as a distance from the placement surface in a depth direction decreases.

12. The electrostatic chuck device according to claim 7, wherein the thickness dimension of the peeling suppression portion and the thickness dimension of the contact portion means a dimension in a depth direction of the second adhesive layer.

13. The electrostatic chuck device according to claim 1, wherein in a plan view of the placement surface, the first adhesive layer is hidden by the porous body.

14. The electrostatic chuck device according to claim 13, wherein in the first through-hole, a tapered surface of which a diameter thereof decreases as a distance from the placement surface in a depth direction increases is provided, and a conical surface facing the tapered surface is provided in the outer peripheral surface of the porous body.

15. The electrostatic chuck device according to claim 1, wherein a second through-hole that is connected to the first through-hole is provided in the base, a cylindrical insulator is inserted into the second through-hole, a recessed groove is provided in an end surface of the cylindrical insulator on an electrostatic chuck plate side, and a part of the first adhesive layer extends up to an inside of the recessed groove.

16. The electrostatic chuck device according to claim 1, wherein the thickness dimension of the first adhesive layer means a dimension of the first adhesive layer in a radial direction of the first through-hole.

17. The electrostatic chuck device according to claim 1, wherein the porous body has a columnar shape or a truncated conical shape of which a diameter thereof decreases as a distance from the placement surface in a depth direction increases, an upper surface of the porous body is exposed from an upper opening of the first through-hole which is located on an electrostatic chuck plate side, so that the upper surface of the porous body is exposed to the placement surface, and a diameter of the porous body is smaller than an inner diameter of the opening of the first through-hole.

18. The electrostatic chuck device according to claim 1, wherein the first adhesive layer has a uniform thickness at an entire area of the first through-hole in the depth direction.

19. The electrostatic chuck device according to claim 1, wherein the thickness of the porous body is same as the thickness of the electrostatic chuck plate in a depth direction.

20. The electrostatic chuck device according to claim 1, wherein the thickness of the porous body is less than the thickness of the electrostatic chuck plate in a depth direction.

* * * * *